US008551885B2

(12) United States Patent
Chen et al.

(10) Patent No.: US 8,551,885 B2
(45) Date of Patent: Oct. 8, 2013

(54) METHOD FOR REDUCING TUNGSTEN ROUGHNESS AND IMPROVING REFLECTIVITY

(75) Inventors: Feng Chen, Milpitas, CA (US); Raashina Humayun, Fremont, CA (US); Abhishek Manohar, Santa Clara, CA (US)

(73) Assignee: Novellus Systems, Inc., Fremont, CA (US)

( * ) Notice: Subject to any disclaimer, the term of this patent is extended or adjusted under 35 U.S.C. 154(b) by 286 days.

(21) Appl. No.: 12/202,126

(22) Filed: Aug. 29, 2008

(65) Prior Publication Data
US 2010/0055904 A1    Mar. 4, 2010

(51) Int. Cl.
*H01L 21/285* (2006.01)
(52) U.S. Cl.
USPC .......................................... 438/680; 118/715
(58) Field of Classification Search
USPC ............. 118/715, 722; 257/E21.168, E21.71; 427/255.28, 255.394; 438/676, 680, 438/681, 685
See application file for complete search history.

(56) References Cited

U.S. PATENT DOCUMENTS

| | | | |
|---|---|---|---|
| 4,746,375 A | 5/1988 | Lacovangelo | |
| 4,804,560 A | 2/1989 | Shioya et al. | |
| 4,874,719 A | 10/1989 | Kurosawa | |
| 5,028,565 A | 7/1991 | Chang et al. | |
| 5,227,329 A | 7/1993 | Kobayashi et al. | |
| 5,250,329 A | 10/1993 | Miracky et al. | |
| 5,326,723 A | 7/1994 | Petro et al. | |
| 5,391,394 A | 2/1995 | Hansen | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,926,720 A | 7/1999 | Zhao et al. | |
| 5,956,609 A | 9/1999 | Lee et al. | |
| 6,001,729 A | 12/1999 | Shinriki et al. | |
| 6,017,818 A | 1/2000 | Lu | |
| 6,037,263 A | 3/2000 | Chang | |

(Continued)

FOREIGN PATENT DOCUMENTS

| JP | 2009-144242 | 7/2009 |
|---|---|---|
| KR | 20050022261 | 3/2005 |

(Continued)

OTHER PUBLICATIONS

Lee et al., PCT Search Report, Completed Oct. 15, 2004, PCT/US2004/006940, Int'l filing date May 3, 2004.

(Continued)

*Primary Examiner* — Julio J Maldonado
*Assistant Examiner* — Daniel Shook
(74) *Attorney, Agent, or Firm* — Weaver Austin Villeneuve & Sampson LLP

(57) ABSTRACT

Methods of producing low resistivity tungsten bulk layers having lower roughness and higher reflectivity are provided. The smooth and highly reflective tungsten layers are easier to photopattern than conventional low resistivity tungsten films. The methods involve CVD deposition of tungsten in the presence of alternating nitrogen gas pulses, such that alternating portions of the film are deposited by CVD in the absence of nitrogen and in the presence of nitrogen. According to various embodiments, between 20-90% of the total film thickness is deposited by CVD in the presence of nitrogen.

21 Claims, 8 Drawing Sheets

(56) References Cited

U.S. PATENT DOCUMENTS

| | | | |
|---|---|---|---|
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A * | 11/2000 | McInerney et al. | 118/719 |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,309,966 B1 | 10/2001 | Govindarajan et al. | |
| 6,310,300 B1 | 10/2001 | Cooney et al. | |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,607,976 B2 | 8/2003 | Chen et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,585 B2 | 5/2004 | Yoon et al. | |
| 6,797,340 B2 | 9/2004 | Fang et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 * | 11/2006 | Lee et al. | 438/627 |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,262,125 B2 | 8/2007 | Wongsenakhum et al. | |
| 7,416,979 B2 | 8/2008 | Yoon et al. | |
| 7,429,402 B2 | 9/2008 | Gandikota et al. | |
| 7,589,017 B2 | 9/2009 | Chan et al. | |
| 7,655,567 B1 | 2/2010 | Gao et al. | |
| 7,691,749 B2 | 4/2010 | Levy et al. | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,977,243 B2 | 7/2011 | Sakamoto et al. | |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,101,521 B1 | 1/2012 | Gao et al. | |
| 8,207,062 B2 | 6/2012 | Gao et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0090796 A1 | 7/2002 | Desai et al. | |
| 2002/0177316 A1 | 11/2002 | Miller et al. | |
| 2003/0059980 A1 | 3/2003 | Chen et al. | |
| 2003/0104126 A1 | 6/2003 | Fang et al. | |
| 2003/0127043 A1 | 7/2003 | Lu et al. | |
| 2004/0014315 A1 | 1/2004 | Lai et al. | |
| 2004/0044127 A1 | 3/2004 | Okubo et al. | |
| 2004/0142557 A1 | 7/2004 | Levy et al. | |
| 2004/0202786 A1 | 10/2004 | Wongsenakhum et al. | |
| 2004/0206267 A1 | 10/2004 | Sambasivan et al. | |
| 2005/0031786 A1 | 2/2005 | Lee et al. | |
| 2005/0059236 A1 | 3/2005 | Nishida et al. | |
| 2005/0136594 A1 | 6/2005 | Kim | |
| 2006/0003581 A1 | 1/2006 | Johnston et al. | |
| 2006/0094238 A1 | 5/2006 | Levy et al. | |
| 2007/0190780 A1 | 8/2007 | Chung et al. | |
| 2008/0045010 A1 | 2/2008 | Wongsenakhum et al. | |
| 2008/0081127 A1 | 4/2008 | Thompson et al. | |
| 2008/0124926 A1 * | 5/2008 | Chan et al. | 438/685 |
| 2008/0254623 A1 | 10/2008 | Chan et al. | |
| 2008/0280438 A1 | 11/2008 | Lai et al. | |
| 2009/0149022 A1 * | 6/2009 | Chan et al. | 438/660 |
| 2009/0160030 A1 | 6/2009 | Tuttle | |
| 2009/0163025 A1 | 6/2009 | Humayun et al. | |
| 2010/0035427 A1 | 2/2010 | Chan et al. | |
| 2010/0055904 A1 | 3/2010 | Chen et al. | |
| 2010/0159694 A1 | 6/2010 | Chandrashekar et al. | |
| 2010/0267230 A1 | 10/2010 | Chandrashekar et al. | |
| 2010/0267235 A1 | 10/2010 | Chen et al. | |
| 2010/0273327 A1 | 10/2010 | Chan et al. | |
| 2011/0059608 A1 | 3/2011 | Gao et al. | |
| 2011/0156154 A1 | 6/2011 | Hoentschel et al. | |
| 2011/0221044 A1 | 9/2011 | Danek et al. | |
| 2011/0223763 A1 | 9/2011 | Chan et al. | |
| 2012/0015518 A1 | 1/2012 | Chandrashekar et al. | |
| 2012/0040530 A1 | 2/2012 | Humayun et al. | |
| 2012/0199887 A1 | 8/2012 | Chan et al. | |

FOREIGN PATENT DOCUMENTS

| | | |
|---|---|---|
| KR | 20050087428 | 8/2005 |
| KR | 20080110897 | 12/2008 |
| WO | WO01/27347 | 4/2001 |
| WO | WO2007/121249 | 10/2007 |
| WO | WO2010/025357 | 3/2010 |

OTHER PUBLICATIONS

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

(56) References Cited

OTHER PUBLICATIONS

U.S. Office Action mailed Jun. 22, 2004, from U.S. Appl. No. 10/435,010.
U.S. Office Action mailed Mar. 23, 2005, from U.S. Appl. No. 10/690,492.
U.S. Office Action mailed Nov. 23, 2005, from U.S. Appl. No. 10/984,126.
Chan et al., "Methods for Growing Low-Resistivity Tungsten Film", Novellus Systems, Inc., filed Nov. 1, 2005, U.S. Appl. No. 11/265,531, pp. 1-35.
Levy et al., "Deposition of Tungsten Nitride", Novellus Systems, Inc., filed Dec. 16, 2005, U.S. Appl. No. 11/305,368, pp. 1-39.
U.S. Office Action mailed Dec. 28, 2005, from U.S. Appl. No. 10/815,560.
U.S. Office Action mailed Dec. 30, 2005, from U.S. Appl. No. 10/649,351.
Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.
U.S. Office Action mailed Apr. 17, 2006, from U.S. Appl. No. 10/815,560.
U.S. Office Action mailed May 17, 2006, from U.S. Appl. No. 10/984,126.
U.S. Office Action mailed Sep. 28, 2006, from U.S. Appl. No. 10/815,560.
Gao et al., "Methods for Improving Uniformity and Resistivity of Thin Tungsten Films," Novellus Systems, Inc, filed Jul. 24, 2007, U.S. Appl. No. 11/782,570, pp. 1-23.
Chan et al., "Methods for Growing Low-Resistivity Tungsten for High Aspect Ratio and Small Features," Novellus Systems, Inc., U.S. Appl. No. 12/030,645, filed Feb. 13, 2008.
Humayun et al., "Methods for Forming All Tungsten Contacts and Lines," Novellus Systems, Inc., U.S. Appl. No. 11/963,698, filed Dec. 21, 2007.
Chan et al., "Method for Improving Uniformity and Adhesion of Low Resistivity Tungsten Film," Novellus Systems, Inc., U.S. Appl. No. 11/951,236, filed Dec. 5, 2007.
Notice of Allowance and Fee Due mailed Mar. 12, 2003, from U.S. Appl. No. 09/975,074.
Allowed Claims from U.S. Appl. No. 09/975,074.
Notice of Allowance and Fee Due mailed Jul. 21, 2006, from U.S. Appl. No. 10/649,351.
Allowed Claims from U.S. Appl. No. 10/649,351.
Notice of Allowance and Fee Due mailed Oct. 7, 2004, from U.S. Appl. No. 10/435,010.
Allowed Claims from U.S. Appl. No. 10/435,010.
Notice of Allowance and Fee Due mailed Aug. 25, 2006, from U.S. Appl. No. 10/984,126.
Notice of Allowance and Fee Due mailed Sep. 14, 2005, from U.S. Appl. No. 10/690,492.
Allowed Claims from U.S. Appl. No. 10/690,492.
Notice of Allowance and Fee Due mailed Apr. 24, 2007, from U.S. Appl. No. 10/815,560.
Allowed Claims from U.S. Appl. No. 10/815,560.
U.S. Office Action mailed Jun. 27, 2008, from U.S. Appl. No. 11/305,368.
U.S. Office Action mailed Aug. 21, 2008, from U.S. Appl. No. 11/265,531.
Ashtiani et al., "Ternary Tungsten-Containing Thin Film Heater Elements," Novellus Systems, Inc., U.S. Appl. No. 61/025,237, filed Jan. 31, 2008.
U.S. Office Action mailed Oct. 16, 2008, from U.S. Appl. No. 11/349,035.
U.S. Office Action mailed Sep. 29, 2008, from U.S. Appl. No. 11/782,570.
Ashtiani et al., "Ternary Tungsten-Containing Thin Films," Novellus Systems, Inc., U.S. Appl. No. 12/363,330, filed Jan. 30, 2009.
Chandrashekar et al., "Method for depositing thin tungsten film with low resistivity and robust micro-adhesion characteristics," Novellus Systems, Inc., U.S. Appl. No. 61/061,078, filed Jun. 12, 2008.
U.S. Notice of Allowance mailed Nov. 17, 2009 from U.S. Appl. No. 11/305,368.
Allowed Claims from U.S. Appl. No. 11/305,368.
U.S. Final Office Action mailed Nov. 20, 2009 from U.S. Appl. No. 11/349,035.
U.S. Final Office Action mailed Dec. 9, 2009 from U.S. Appl. No. 11/963,698.
U.S. Notice of Allowance mailed Sep. 17, 2009 from U.S. Appl. No. 11/782,570.
Allowed Claims from U.S. Appl. No. 11/782,570.
Chan et al., "Methods for Growing Low-Resistivity Tungsten Film1", Novellus Systems Inc., U.S. Appl. No. 12/538,770, filed Aug. 10, 2009.
U.S. Final Office Action mailed Jan. 13, 2010 from U.S. Appl. No. 12/030,645.
Gao et al., "Method for Improving Adhesion of Low Resistivity Tungsten/Tungsten Nitride Layers," Novellus Systems, Inc., U.S. Appl. No. 12/556,490, filed Sep. 9, 2009.
Gao et al., "Methods for Improving Uniformity and Resistivity of Thin Tungsten Films," Novellus Systems, Inc, filed Dec. 11, 2009, U.S. Appl. No. 12/636,616.
U.S. Office Action mailed Jan. 26, 2010 from U.S. Appl. No. 11/951,236.
U.S. Notice of Allowance mailed Mar. 2, 2010 from U.S. Appl. No. 11/349,035.
Allowed Claims from U.S. Appl. No. 11/349,035.
Danek, et al, "Tungsten Barrier and Seed for Copper Filled TSV," Novellus Systems, Inc., filed Mar. 12, 2010, U.S. Appl. No. 12/723,532.
Chandrashekar, et al., "Method for Forming Tungsten Contacts and Interconnects with Small Critical Dimensions," Novellus Systems, Inc, filed Apr. 6, 2010, U.S. Appl. No. 12/755,248.
Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.
U.S. Notice of Allowance and Allowed Claims mailed Apr. 6, 2010 from U.S. Appl. No. 11/951,236.
U.S. Office Action mailed May 3, 2010 from U.S. Appl. No. 12/407,541.
Chan et al., "Method for Improving Uniformity and Adhesion of Low Resistivity Tungsten Film," Novellus Systems, Inc., U.S. Appl. No. 12/829,119, filed Jul. 1, 2010.
U.S. Office Action mailed Jun. 11, 2010 from U.S. Appl. No. 11/963,698.
U.S. Final Office Action mailed Jul. 23, 2010 from U.S. Appl. No. 12/030,645.
International Search Report and Written Opinion mailed Apr. 12, 2010 from Application No. PCT/US2009/055349.
Hoover, Cynthia, "Enabling Materials for Contact Metallization," Praxair Electronic Materials R&D, Jul. 2007, pp. 1-16.
Purchase of ethylcyclopentadienyl)dicarbonylnitrosyltungsten from Praxair in Oct. 2006.
U.S. Final Office Action mailed Oct. 19, 2010 from U.S. Appl. No. 12/407,541.
U.S. Office Action for U.S. Appl. No. 12/538,770 mailed Nov. 23, 2010.
U.S. Final Office Action for U.S. Appl. No. 11/963,698 mailed Dec. 30, 2010.
U.S. Office Action for U.S. Appl. No. 12/636,616 mailed Jan. 25, 2011.
Notice of Allowance and Fee Due mailed Jan. 24, 2011, from U.S. Appl. No. 12/030,645.
Allowed Claims from U.S. Appl. No. 12/030,645 as of Jan. 24, 2011.
Chan et al., "Methods for Growing Low-Resistivity Tungsten for High Aspect Ratio and Small Features," Novellus Systems, Inc., U.S. Appl. No. 13/095,734, filed Apr. 27, 2011.
U.S. Office Action for U.S. Appl. No. 12/407,541 mailed May 2, 2011.
U.S. Office Action for U.S. Appl. No. 12/755,248 mailed May 13, 2011.

(56) References Cited

OTHER PUBLICATIONS

U.S. Appl. No. 13/560,688, filed Jul. 27, 2012, entitled "Methods of improving Tungsten Contact Resistance in Small Critical Dimension Features,".
U.S. Appl. No. 13/633,798, filed Oct. 2, 2012, entitled "Method for Depositing Tungsten Film With Low Roughness and Low Resistivity,".
U.S. Appl. No. 13/633,502, filed Oct. 2, 2012, entitled "Method for Producing Ultra-Thin Tungsten Layers With Improved Step Coverage,".
US Office Action, dated Apr. 3, 2009, issued in U.S. Appl. No. 11/305,368.
US Final Office Action, dated Feb. 26, 2009, issued in U.S. Appl. No. 11/265,531.
US Notice of Allowance, dated May 4, 2009, issued in U.S. Appl. No. 11/265,531.
US Notice of Allowance, dated Jun. 30, 2011, issued in U.S. Appl. No. 12/538,770.
US Final Office Action, dated Feb. 25, 2009, issued in U.S. Appl. No. 11/349,035.
US Office Action, dated Jun. 4, 2009, issued in U.S. Appl. No. 11/349,035.
US Final Office Action, dated Apr. 28, 2009, issued in U.S. Appl. No. 11/782,570.
US Final Office Action, dated Jun. 15, 2011, issued in U.S. Appl. No. 12/636,616.
US Notice of Allowance, dated Sep. 30, 2011, issued in U.S. Appl. No. 12/636,616.
US Office Action, dated Jun. 24, 2009, issued in U.S. Appl. No. 12/030,645.
US Office Action, dated Aug. 6, 2012, issued in U.S. Appl. No. 13/095,734.
Notice of Allowance dated Dec. 3, 2012, issued in U.S. Appl. No. 13/095,734.
US Office Action, dated Aug. 5, 2009, issued in U.S. Appl. No. 11/951,236.
US Office Action, dated Jun. 30, 2011, issued in U.S. Appl. No. 12/829,119.
US Final Office Action, dated Nov. 17, 2011, issued in U.S. Appl. No. 12/829,119.
US Office Action, dated Apr. 19 2012, issued in U.S. Appl. No. 12/829,119.
US Notice of Allowance, dated Aug. 7, 2012, issued in U.S. Appl. No. 12/829,119.
US Office Action, dated Jun. 11, 2009, issued in U.S. Appl. No. 11/963,698.
US Notice of Allowance, dated Sep. 2, 2011, issued in U.S. Appl. No. 11/963,698.
US Office Action, dated Apr. 16 2012, issued in U.S. Appl. No. 13/276,170.
US Notice of Allowance, dated Oct. 4, 2012, issued in U.S. Appl. No. 13/276,170.
US Notice of Allowance, dated Jul. 25, 2011, issued in U.S. Appl. No. 12/363,330.
US Notice of Allowance, dated Sep. 19, 2011, issued in U.S. Appl. No. 12/407,541.
US Office Action, dated Mar. 6, 2012, issued in U.S. Appl. No. 13/244,016.
Notice of Allowanace dated Nov. 29, 2012, issued in U.S. Appl. No. 13/244,016.
US Office Action, dated Jun. 14, 2011, issued in U.S. Appl. No. 12/556,490.
US Notice of Allowance, dated Mar. 2, 2012, issued in U.S. Appl. No. 12/556,490.
US Office Action, dated Oct. 28, 2011, issued in U.S. Appl. No. 12/755,248.
US Final Office Action, dated Apr. 30, 2012, issued in U.S. Appl. No. 12/755,248.
US Office Action, dated Feb. 15, 2013, issued in U.S. Appl. No. 12/755,248.
US Office Action dated Dec. 18, 2012, issued in U.S. Appl. No. 12/723,532.
US Office Action, dated Feb. 16, 2012, issued in U.S. Appl. No. 12/755,259.
US Final Office Action, dated Sep. 12, 2012, issued in U.S. Appl. No. 12/755,259.
US Office Action, dated May 10, 2012, issued in U.S. Appl. No. 13/020,748.
US Final Office Action, dated Nov. 16, 2012, issued in U.S. Appl. No. 13/020,748.
Korean First Notification of Provisional Rejection, dated Dec. 8, 2010, issued in Application No. 2004-0036346.
Korean Second Notification of Provisional Rejection, dated Aug. 25, 2011, issued in Application No. 2004-0036346.
Korean Office Action, dated Jun. 13, 2011, issued in Application No. 2011-0032098.
Chinese Office Action dated Sep. 18, 2012 issued in application No. 200980133560.1.
Korean Office Action dated Sep. 6, 2012 issued in application No. 2011-7004322.
Korean Office Action dated Mar. 21, 2013 issued in KR Application No. 2010-0024905.
Korean Notification of Provisional Rejection dated Jul. 17, 2012, issued in Application No. 2010-0087997.
Korean Office Action dated Mar. 4, 2013 in KR Application No. 2010-0035449.
Korean Office Action dated Mar. 4, 2013 in KR Application No. 2010-0035453.
Ken K. Lai and H. Henry Lamb. (1995) "Precursors for Organometallic Chemical Vapor Deposition of Tungsten Carbide Films", Chemistry Material, pp. 2284-2292.
Korean Office Action dated Jul. 19, 2013 issued in application No. 2011-7004322.

* cited by examiner

METHOD FOR REDUCING TUNGSTEN ROUGHNESS AND IMPROVING REFLECTIVITY

FIELD OF INVENTION

This invention relates to methods for preparing tungsten films. Embodiments of the invention are useful for integrated circuit applications that require thin tungsten films having low electrical resistivity, low roughness and high reflectivity.

BACKGROUND

The deposition of tungsten films using chemical vapor deposition (CVD) techniques is an integral part of many semiconductor fabrication processes. Tungsten films may be used as low resistivity electrical connections in the form of horizontal interconnects, vias between adjacent metal layers, and contacts between a first metal layer and the devices on the silicon substrate. In a conventional tungsten deposition process, the wafer is heated to the process temperature in a vacuum chamber, and then a very thin portion of tungsten film, which serves as a seed or nucleation layer, is deposited. Thereafter, the remainder of the tungsten film (the bulk layer) is deposited on the nucleation layer. Conventionally, the tungsten bulk layer is formed by the reduction of tungsten hexafluoride ($WF_6$) with hydrogen ($H_2$) on the growing tungsten layer.

SUMMARY OF INVENTION

The present invention provides methods of producing low resistivity tungsten bulk layers having lower roughness and higher reflectivity. The smooth and highly reflective tungsten layers are easier to photopattern than conventional low resistivity tungsten films. The methods involve CVD deposition of tungsten in the presence of alternating nitrogen gas pulses, such that alternating portions of the film are deposited by CVD in the absence of nitrogen and in the presence of nitrogen. According to various embodiments, between 20-90% of the total film thickness is deposited by CVD in the presence of nitrogen.

BRIEF DESCRIPTION OF THE DRAWINGS

The following detailed description can be more fully understood when considered in conjunction with the drawings in which.

DETAILED DESCRIPTION

Introduction

In the following description, numerous specific details are set forth in order to provide a thorough understanding of the present invention, which pertains to forming thin tungsten films. Modifications, adaptations or variations of specific methods and structures shown and discussed herein will be apparent to those skilled in the art and are within the scope of this invention.

The methods described herein relate to forming tungsten films. Conventional processes for forming a tungsten film on a surface involve forming a tungsten nucleation layer on the surface, and then performing a CVD operation.

Embodiments of the present invention involve depositing tungsten layers that have low resistivity, low roughness and high reflectivity. In previous processes, low resistivity tungsten film has been achieved by growing large tungsten grains. This, however, increases the roughness of the film. As a result, percentage root mean square (RMS) roughness to film thickness may exceed 10% for a low resistivity tungsten film of 500 A or greater film. Lowering the roughness of the film makes subsequent operations (patterning, etc.) easier.

The methods described also provide highly reflective films. Conventional processes for depositing bulk tungsten layers involve hydrogen reduction of tungsten-containing precursors in chemical vapor deposition (CVD) processes. The reflectivity of a 1000 A film that is grown by conventional hydrogen reduction CVD is 110% or less compared to that of a silicon surface. In certain applications, however, tungsten films having greater reflectivity are needed. For example, tungsten films having low reflectivity and high roughness can make photopatterning tungsten, e.g., to form bitlines or other structures, more difficult.

Figure 1:
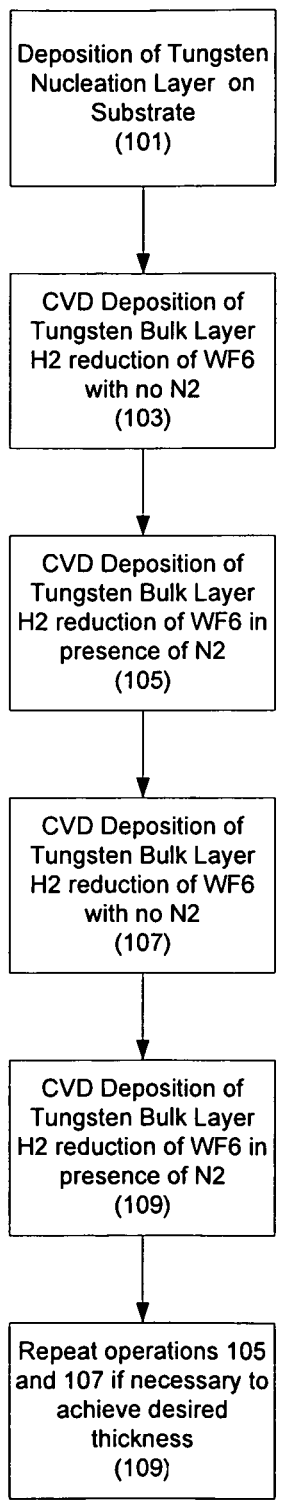
FIG. 1 is a process flow sheet showing relevant operations of methods according to various embodiments of the present invention.

The methods described herein involve depositing tungsten by H2 CVD reduction in the presence of alternating nitrogen gas pulses. While it is known that tungsten deposition in the presence of nitrogen gas decreases tungsten roughness, the inventors have found that alternating CVD deposition in the presence of nitrogen with CVD deposition with no nitrogen present produces films improves reflectivity and roughness. FIG. 1 shows a process according to certain embodiments of the invention. The process begins by depositing a tungsten nucleation layer on a substrate in an operation 101. In general, a nucleation layer is a thin conformal layer which serves to facilitate the subsequent formation of a bulk material thereon. In certain embodiments, the nucleation layer is deposited using a pulsed nucleation layer (PNL) technique. In a PNL technique, pulses of the reducing agent, purge gases, and tungsten-containing precursors are sequentially injected into and purged from the reaction chamber. The process is repeated in a cyclical fashion until the desired thickness is achieved. PNL broadly embodies any cyclical process of sequentially adding reactants for reaction on a semiconductor substrate.

As features become smaller, the tungsten (W) contact or line resistance increases due to scattering effects in the thinner W film. While efficient tungsten deposition processes require tungsten nucleation layers, these layers typically have higher electrical resistivities than the bulk tungsten layers. Low resistivity tungsten films minimize power losses and overheating in integrated circuit designs. Because the $\rho_{nucleation} > \rho_{bulk}$, the thickness of the nucleation layer should be minimized to keep the total resistance as low as possible. On the other hand, the tungsten nucleation should be sufficiently thick to fully cover the underlying substrate to support high quality bulk deposition.

PNL techniques for depositing tungsten nucleation layers that have low resistivity and that support deposition of low resistivity tungsten bulk layers are described in U.S. patent applications Ser. Nos. 12/030,645, 11/951,236 and 61/061, 078, incorporated by reference herein. Additional discussion regarding PNL type processes can be found in U.S. Pat. Nos. 6,635,965, 6,844,258, 7,005,372 and 7,141,494 as well as in U.S. patent application Ser. No. 11/265,531, also incorporated herein by reference.

Figure 2:
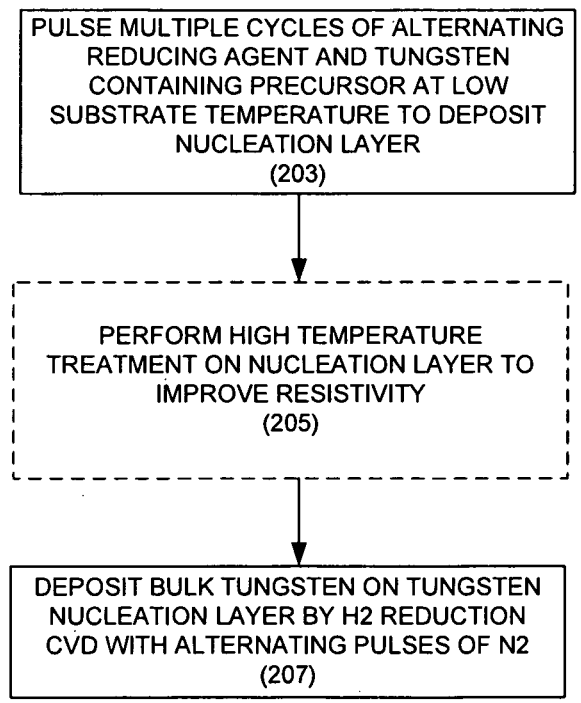
FIG. 2 is a process flow sheet showing relevant operation of methods of depositing a tungsten nucleation layer.

FIG. 2 presents a process flow sheet showing an overview of operations that may be used in depositing a low resistivity tungsten nucleation layer by PNL according to certain embodiments. The process shown in FIG. 2 involves forming a tungsten nucleation layer using a pulsed nucleation layer process at low temperature and then treating the deposited nucleation layer prior to depositing the bulk tungsten fill. In certain embodiments, the substrate contains a feature that has a high aspect ratio and/or narrow width. In other embodiments, the methods are used to deposit low resistivity tungsten film on planar surfaces and surfaces having lower aspect ratio features and wider features.

As indicated by a process block 203, a low temperature pulsed nucleation layer (PNL) process is performed to deposit a tungsten nucleation layer. Depositing tungsten nucleation layer using a PNL process involves exposing the substrate to alternating pulses of a reducing agent and a tungsten-containing precursor, such as $WF_6$. Low temperature tungsten nucleation layer processes to deposit conformal nucleation layers are described in U.S. patent application Ser. No. 11/265,531, filed Nov. 1, 2005, incorporated by reference herein in its entirety and for all purposes. In the embodiment depicted in FIG. 2, the substrate temperature is low—below about 350 C, for example between about 250 and 350 C or 250 and 325 C. In certain embodiments, the temperature is around 300 C. Above-referenced application Ser. No. 11/265,531 describes sequences of reducing agent/tungsten-containing precursor pulses that result may be used to deposit low resistivity film. According to various embodiments, boron-containing (e.g., diborane) and non-boron-containing (e.g., silane) reducing agents are used to deposit the nucleation layers. Also, in certain embodiments, nucleation layer deposition includes one or more high temperature (e.g., 395° C.) PNL cycles after the low temperature cycles. In certain embodiments, methods for depositing tungsten nucleation layers in very small/high aspect ratio features as described in U.S. patent application Ser. No. 12/030,645, filed Feb. 13, 2008, incorporated by reference herein in its entirety and for all purposes, are used to deposit the nucleation layer. These methods involve using PNL cycles of a boron-containing reducing agent and a tungsten-containing precursor with no hydrogen in the background to deposit very thin tungsten nucleation layers (e.g., about 12 Angstroms) in these features that have good step coverage. In certain embodiments following these methods, diborane or (another borane or boron-containing reducing agent) is the only reducing agent used during deposition of the nucleation layer.

Referring back to FIG. 2, an optional operation 205 involves a higher temperature treatment process to lower resistivity. Examples of treatment process such are described in such as that described in U.S. patent application Ser. Nos. 11/951,236, and 61/061,078, incorporated by reference herein in its entirety and for all purposes. The treatment process described therein involves exposing the deposited nucleation layer to multiple pulses of a reducing agent (without intervening pulses of another reactive compound). According to various embodiments, the substrate having the nucleation layer deposited thereon is exposed to multiple cycles of reducing agent pulses, or in some embodiments, alternating reducing agent and a tungsten-containing precursor pulses. Alternating pulses of a reducing agent and tungsten-containing precursor are also used to deposit the tungsten nucleation As indicated in FIG. 2, the treatment process is performed at a higher temperature than the nucleation layer deposition. Temperatures range from 375 C to 415 C, e.g., about 395 C. Transitioning from nucleation layer deposition to this treatment operation may involve heating the substrate to between about 350 C and 415 C, or in certain embodiments to about 375 C to 415 C and allowing it to stabilize before exposing the nucleation layer to a plurality of reducing agent or reducing agent/tungsten-containing precursor pulses in process. As indicated in certain embodiments the substrate temperature is about 395 C. Lower temperatures would require longer pulse times to achieve equivalent treatment effect layer, but in the treatment operation, typically substantially no tungsten is deposited. While the treatment process described in operation 205 may be used to improve adhesion, the methods of the invention may be implemented without it. Returning to FIG. 2, once the tungsten nucleation layer is treated, a bulk tungsten layer is deposited in the feature in a process operation 207. This is described in operations 103-109 of FIG. 1, as discussed below.

While FIG. 2 presents operations in a method of deposition low resistivity tungsten nucleation layers according to certain embodiments, the methods described herein are not limited to a particular method of tungsten nucleation layer deposition, but include deposition bulk tungsten film on tungsten nucleation layers formed by any method including PNL, atomic layer deposition (ALD), CVD, and any other method.

Returning to FIG. 1, after the tungsten nucleation layer is deposited, and any desired treatment has been performed, the bulk tungsten layer is deposited. Deposition begins by a CVD process in which a tungsten-containing precursor is reduced by hydrogen to deposit tungsten. While tungsten hexafluoride (WF6) is often used, the process may be performed with other tungsten precursors, including, but not limited to, WCl6. In addition, while hydrogen is generally used as the reducing agent in the CVD deposition of the bulk tungsten layer, other reducing agents including silane may be used in addition or instead of hydrogen without departing from the scope of the invention. In another embodiment, W(CO)6 may be used with or without a reducing agent. The benefits derived from nitrogen (N2) exposure may also be derived from exposure to other carrier gases that contain nitrogen, including NH3. By using NH3, or other types of nitrogen-containing precursors, the process described may be modified to deposit tungsten nitride with similar advantages.

Unlike with the PNL processes described above, in a CVD technique, the $WF_6$ and $H_2$ are simultaneously introduced into the reaction chamber. This produces a continuous chemical reaction of mix reactant gases that continuously forms tungsten film on the substrate surface.

The CVD deposition begins in an operation 103 in which the tungsten-containing precursor and hydrogen are introduced into the reaction chamber without any nitrogen being present. In certain embodiments, argon or another carrier gas is used as a carrier gas. The gases may be pre-mixed or not. The gases are allowed to react to deposit a portion of the desired total thickness of tungsten. As discussed below, the amount of tungsten deposited in this operation depends in part on the total desired thickness. For example, in certain embodiments, about 100 A is deposited in this operation. Next, in an operation 105, another portion of the tungsten layer is deposited by H2 reduction of WF6 or other tungsten-precursor, in the presence of nitrogen. Generally, transitioning from operation 103 (H2-WF6 reduction/no N2) to operation 105 (H2-WF6 reduction/N2) involves turning on a flow of N2 into the chamber, such that N2, H2 and WF6 are all flowing into the chamber. The argon or other gas flow may be reduced or stopped during this portion of the process to compensate for the additional (N2) gas introduced, thereby balancing the flows. Another portion of the tungsten layer is deposited in this operation. In certain embodiments, if the desired amount of tungsten has been deposited, the process ends here. For depositing thick films, e.g., 1000 A, more cycles are performed. This is indicated at an operation 107, in which H2-WF6 reduction CVD without nitrogen present is again performed. Transitioning from operation 105 to operation 107 typically involves turning off the flow of nitrogen, and if necessary, re-introducing any flow of argon or other gas that was reduced or stopped for operation 105. Another portion of the tungsten layer is deposited. Another pulse of nitrogen is then introduced in an operation 109, to deposit another portion of the tungsten layer again in the presence of nitrogen. One or more additional cycles of no-N2 and N2 H2 reductions of WF6 are then performed if necessary to reach the desired thickness. In certain embodiments, the process may also end after a H2-only reduction.

Figure 3A:
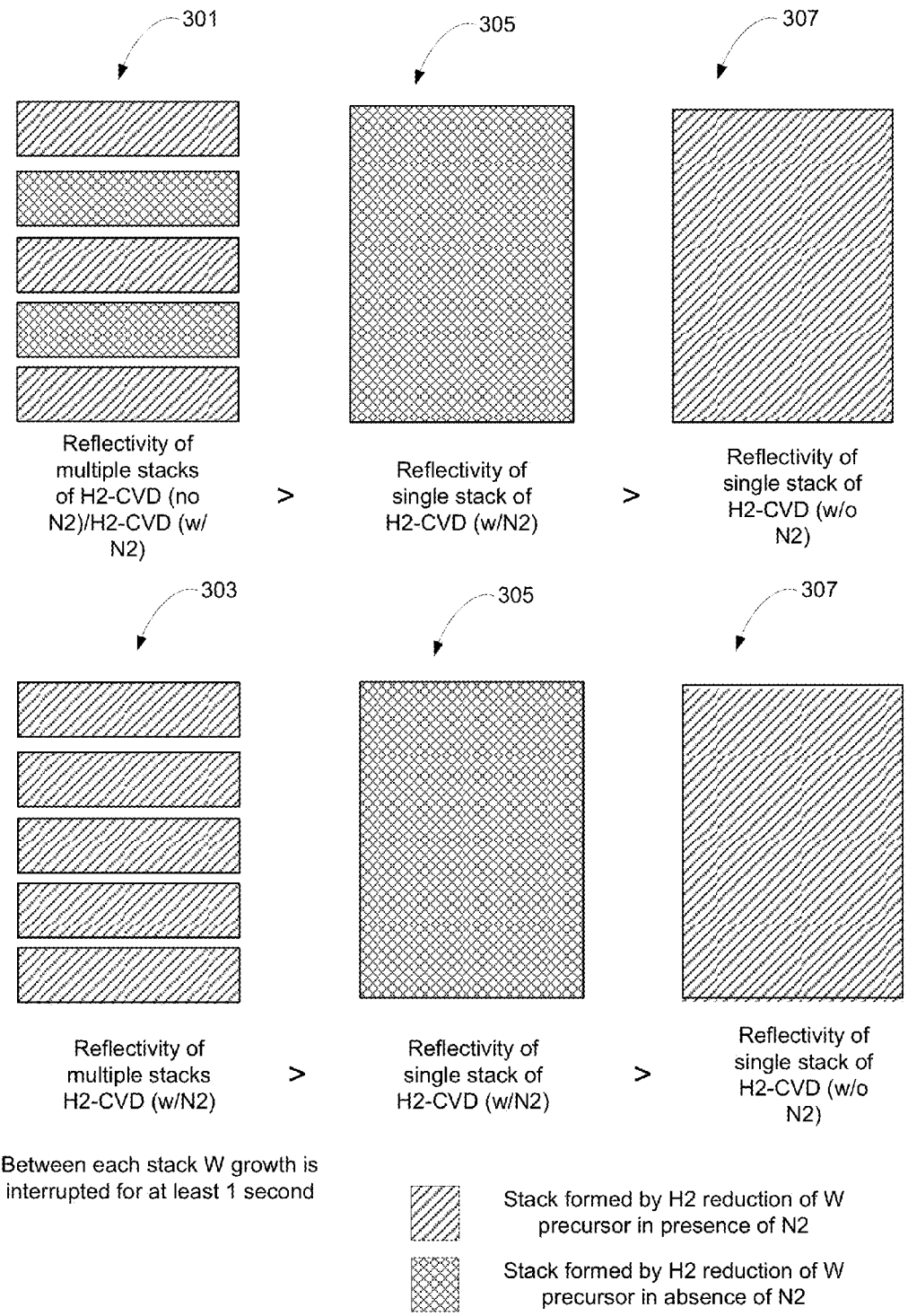
FIG. 3A is a schematic illustration comparing multi-stack and single stack tungsten bulk layers.

In another embodiment, pulses of N2 and tungsten containing precursor are simultaneously introduced into the chamber (e.g., with N2 as the carrier gas for the tungsten precursor) with delays such that pulsed N2-present reduction operations are performed without any intervening H2-only reduction operations. As shown in the schematic of FIG. 3A, multi-stack bulk tungsten layers formed either by alternating H2-only CVD reduction with N2-present CVD (301) or formed by only using N2-present CVD (303) both have higher reflectivity than a single N2-present stack (305), which in turn is more reflective than a single H2-only stack (307). Note that there is at least a one second delay between N2 pulses to form the multiple N2-present stacks.

Figure 3B:
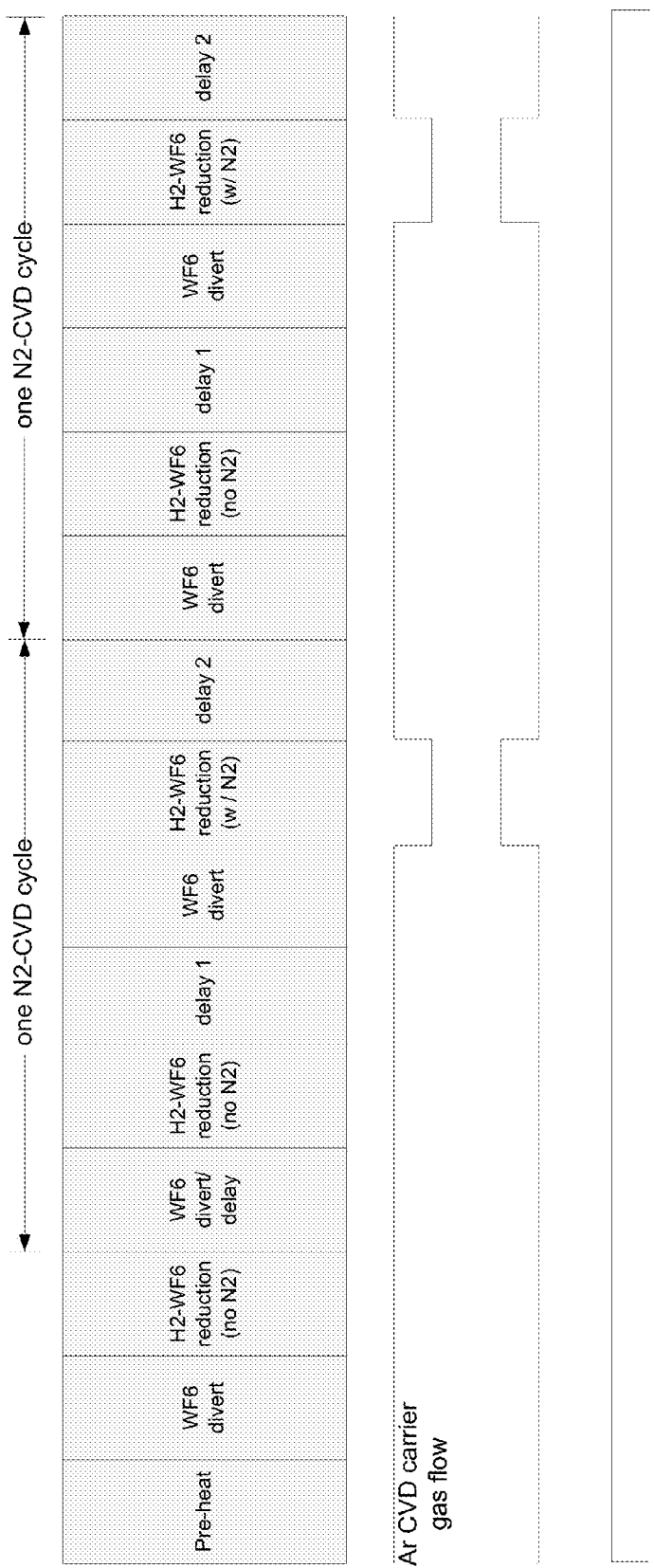
FIG. 3B shows an example of a timing sequence according to various embodiments of the invention.

FIG. 3B shows an example of a timing sequence according to certain embodiments of the invention. Prior to beginning the N2 CVD cycles described in operations 103-109 above, a pre-heat and first H2 (no N2) reduction may occur as indicated. Both the pre-heat the first deposition are optional. In certain embodiments, pre-heating the wafer, e.g., to 395 C, aids in decreasing resistance non-uniformity. Also, in certain embodiments, to achieve good response and repeatability, the tungsten precursor agent may be diverted to a process vacuum pump. This allows the flow to stabilize before introducing the precursor into the deposition chamber. In the embodiment depicted in FIG. 3B, the WF6 flow is diverted before and after each CVD deposition, with the WF6 flowed into the chamber during the deposition. Two cycles of the N2-CVD deposition are depicted in FIG. 3B, though the number of N2-CVD cycles may range from 1 to any desired number. It has been found that multiple N2-CVD cycles, e.g., 2-5, improve the roughness over a single cycle. Each N2-CVD cycle has a H2-only reduction, followed by a delay (delay 1). This delay may range from 0-1 min, e.g., 2 or 3 seconds. Note that although depicted sequentially, the WF6 divert and the delays are typically concurrent, i.e., the WF6 is diverted during the delay between reductions. In certain embodiments, there is no divert and tungsten is flowed into the chamber throughout the process. Each N2-CVD cycle also has a H2 reduction with N2, also followed by a delay (delay 2). A delay of at least 1-3 seconds has been shown to improve the roughness over processes that do not have a delay after the N2-present H2 reduction. It is believed that this is due to the nitrogen remaining in the chamber passivating the surface of the deposited film, allowing the following H2-only film to deposit in a smoother fashion.

Tungsten precursor flow is indicated on the timing sequence. Argon or other carrier gas, hydrogen and nitrogen flow into the chamber is indicated below the sequence. As shown, argon flow remains constant, except for the H2 reduction in N2, in which it is reduced or stopped to account for the additional N2 gas. H2 remains constant throughout the process, while N2 is flowed only during the H2 reduction in the presence of N2.

Note that this process differs considerably from previous H2-WF6 CVD reduction processes to deposit bulk tungsten layers. Previous processes use one set of CVD conditions and gases to deposit the bulk layer. U.S. Pat. No. 7,141,494 describes H2 reduction of WF6 in the presence of nitrogen to deposit a tungsten bulk layer. As described in that patent, a process gas including, e.g., WF6-H2, WF6-B2H6 or W(CO)6 is introduced into the chamber. Nitrogen is also introduced into the deposition chamber, either before, during or after the process gas is introduced into the chamber. In certain situations, the nitrogen is introduced just after the deposition process begins in order to allow the tungsten to nucleate. Once the nitrogen is introduced, however, the deposition proceeds without additional pulsing of the nitrogen. As described below, however, while the process described in the '494 patent results in improved roughness over tungsten deposited in the absence of hydrogen, pulsing nitrogen throughout the process results in improving roughness and improving reflectivity.

Table 1 shows comparisons in reflectivity between tungsten film produced with H2 reduction with alternating N2 pulses, film produced by H2 reduction without any N2, and film produced by H2 reduction with N2 running during the entire deposition.

TABLE 1

| Nucleation Layer Process (PNL deposition of W nucleation) | CVD Process (H2 reduction of WF6) | Thickness (Angstroms) | Resistivity (micro-ohm-cm) | Reflectivity (centerpoint) compared to Si wafer | Reflectivity (centerpoint) compared to Si wafer | Ref NU |
|---|---|---|---|---|---|---|
| Process 1 | Without N2 | 1000 | 11.12 | 1.13 | 1.11 | 1.60 |
| Process 1 | With N2 (throughout) | 1026 | 12.08 | 1.19 | 1.18 | 0.87 |
| Process 1 | Without N2/With | 1034 | 12.82 | 1.20 | 1.20 | 0.80 |

TABLE 1-continued

| Nucleation Layer Process (PNL deposition of W nucleation) | CVD Process (H2 reduction of WF6) | Thickness (Angstroms) | Resistivity (micro-ohm-cm) | Reflectivity (centerpoint) compared to Si wafer | Reflectivity (centerpoint) compared to Si wafer | Ref NU |
|---|---|---|---|---|---|---|
| | N2/Without N2/With N2 | | | | | |
| Process 2 | With N2 (throughout) | 1060 | 12.35 | 1.15 | 1.14 | 0.53 |
| Process 2 | Without N2/With N2/Without N2/With N2 | 1049 | 12.44 | 1.19 | 1.18 | 0.57 |

Tungsten nucleation layer deposition was performed by a PNL process as described above. Both processes 1 and 2 used alternating pulses of diborane and tungsten hexafluoride at low temperature, with process 2 also including a low resistivity treatment as described above with respect to FIG. 2. Compared to both the H2-only and the H2, with N2 throughout, reductions, the alternating N2 process shows higher reflectivity (average reflectivity 1.2 vs. 1.18 and 1.11 for process 1; 1.18 vs. 1.14 for process 2). Resistance non-uniformity is also improved for process 1.

In addition to the improvement in reflectivity, roughness is improved for the alternating pulse process over both of the other processes. While it is generally known that H2 reduction of WF6 in the presence of N2 improves roughness, as compared to H2 reduction of WF6 with no N2, unexpectedly alternating H2-only CVD reduction with N2 H2 CVD reduction further improves roughness reduction. Without being bound by a particular theory, it is believed that the following mechanism may account for this phenomena: tungsten deposition with nitrogen gas present during the entire period may grow grains in certain preferred, such that alternating the nitrogen gas flow may break this continuity of grain growth; the presence of nitrogen gas may suppress certain nucleation sites on the tungsten growing surface, therefore some ensured tungsten grains may not follow the previous template.

In Table 1, while film resistivity increases slightly with the addition of N2, the process still produces films having resistivities below 13 micro-ohm-cm. Thus, the process is able to achieve the low resistivities obtainable with large grain size and still have the smoothness normally achieved with small grain size. This is because the grain size remains approximately the same as without the nitrogen exposure.

Figure 4:
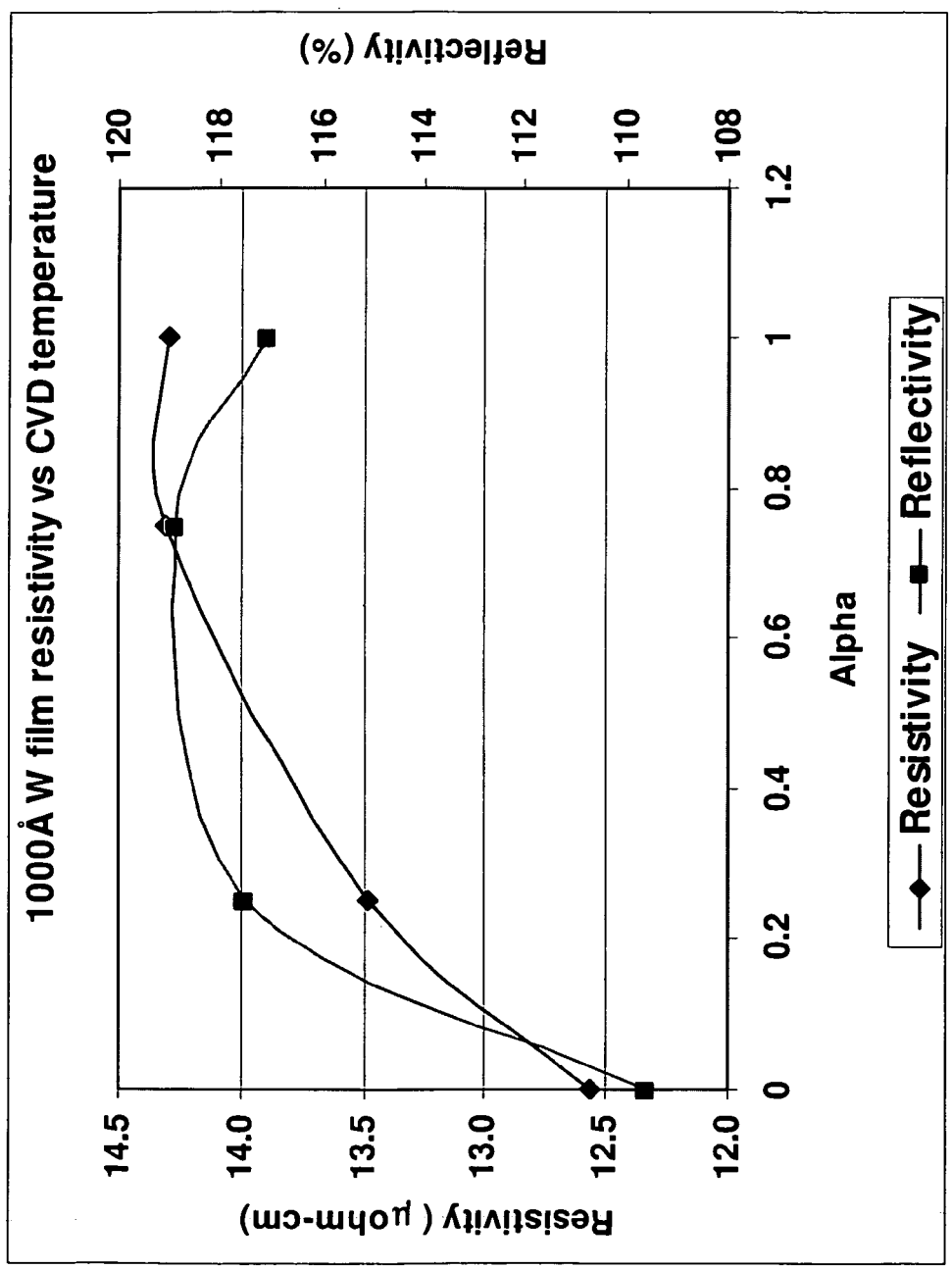
FIG. 4 is a graph showing reflectivity and resistivity of a tungsten bulk layer as a function of the percentage of film deposited in the presence of nitrogen.

In another aspect of the invention, the film resistivity and roughness is optimized by the mixture of H2-CVD in the presence of N2 stacks and H2-only CVD stacks. (H2-CVD referring to H2 reduction of WF6 to deposit W by CVD). Specifically, by controlling the ratio of film deposited by H2 reduction in the presence of H2 to the total film, the resistivity and reflectivity can be optimized. This is shown in FIG. 4, which shows film resistivity and reflectivity of 1000 A W films for various alphas, where alpha is the total thickness deposited by H2 reduction in the presence of N2 divide by the total thickness deposited by H2 reduction without N2. The total thickness includes thickness deposited by all cycles. The data for alpha=0 corresponds to H2-only processes, and the data for alpha=1 corresponds to processes in which N2 is present for most or substantially all of the CVD reduction. FIG. 4 shows that the resistivity increases with alpha, and then begins to plateau or even decrease with alpha around 0.8. Reflectivity increases for alpha between about 0 and 0.8, and then decreases around 1.0. Accordingly, optimize the reflectivity and resistivity (desiring higher reflectivity and lower resistivity), in certain embodiments, alphas between about 0.2 and 0.9 are used. In particular embodiments, alphas between 0.4 and 0.8 are used. In other embodiments, alphas between 0.4 and 0.8 are used, or more particularly between 0.6 and 0.8. Alpha is controlled by controlling the amount of film deposited by each of the H2-only CVD operations and each of the N2-present CVD operations. Thus, to get alpha of 0.5, each reduction operation in a single N2-CVD cycle (a cycling including a H2-only reduction and a N2-present reduction) deposits about the same amount of material.

Figure 5:
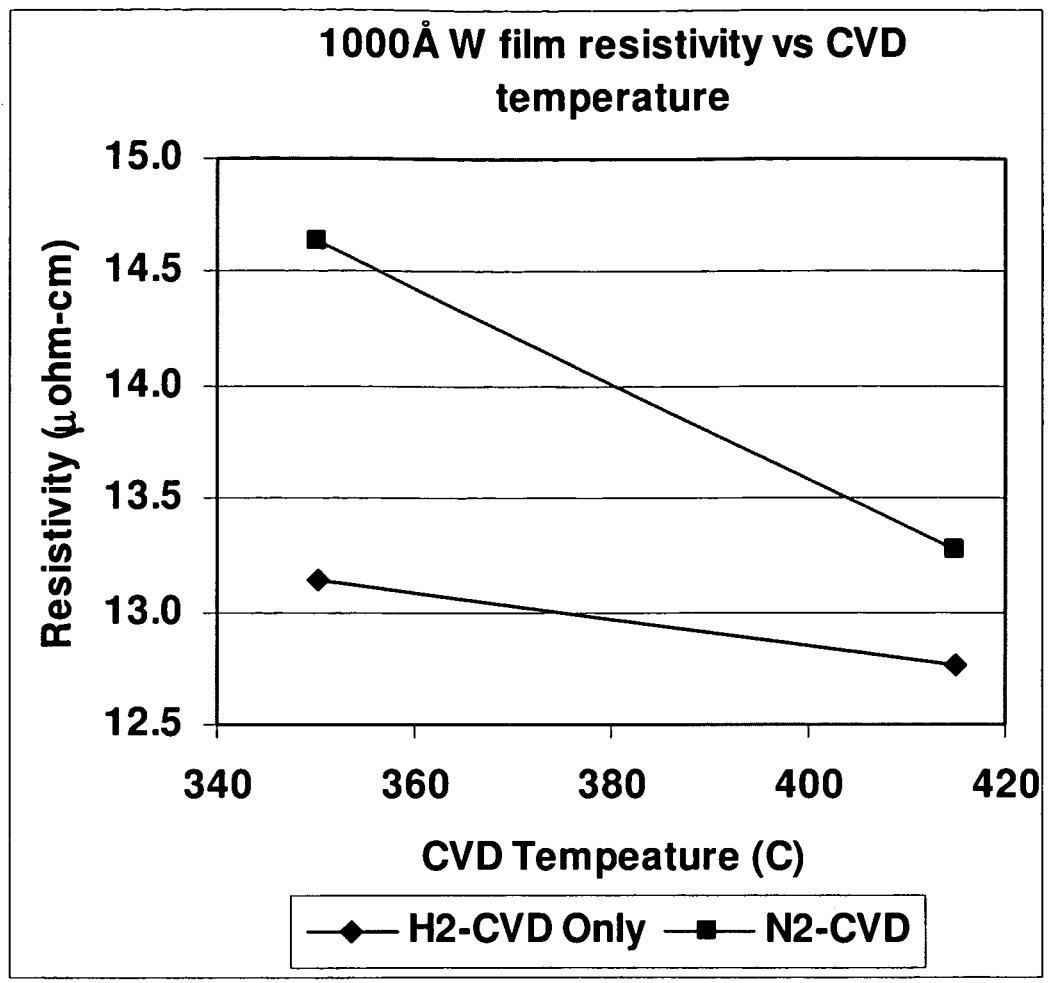
FIG. 5 is a graph showing the temperature dependence of resistivity for 1000 A tungsten films deposited by CVD in the presence of nitrogen and in a nitrogen-free process.
Figure 6:
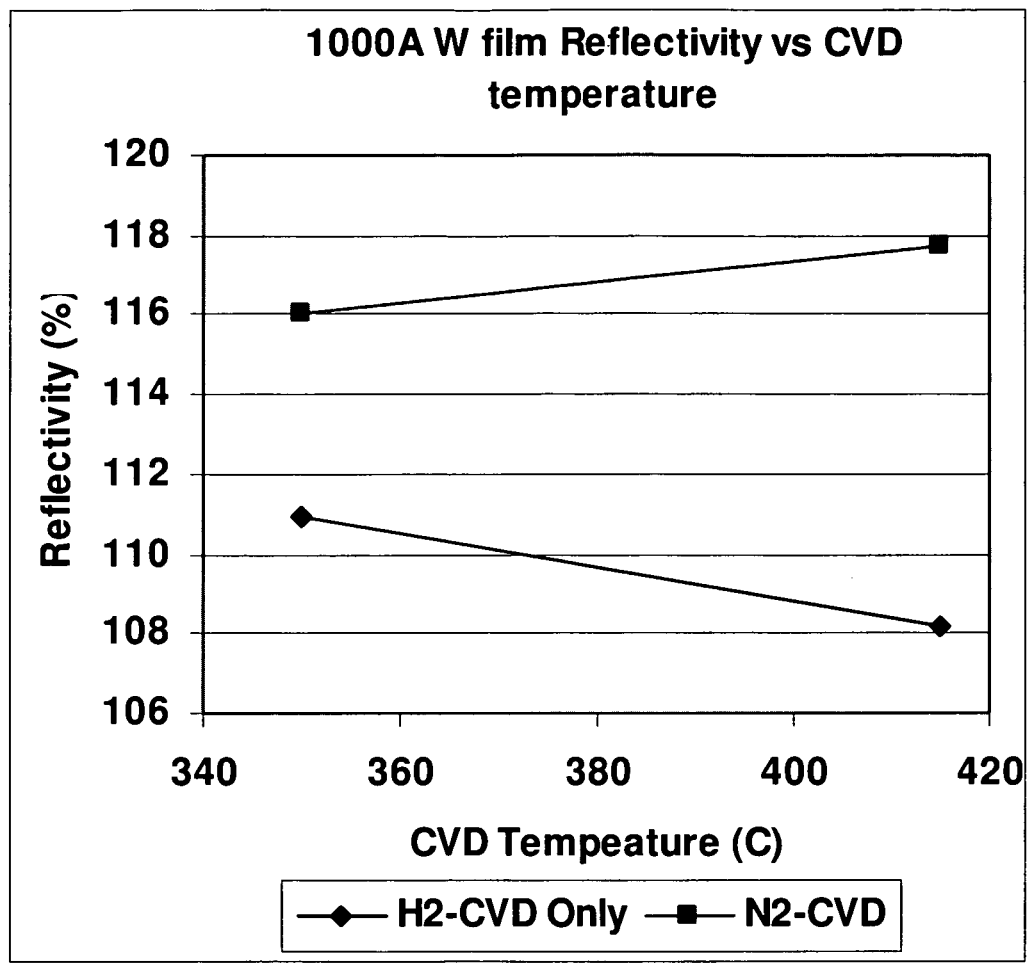
FIG. 6 is a graph showing the temperature dependence of reflectivity for 1000 A tungsten films deposited by CVD in the presence of nitrogen and in a nitrogen-free process.

In another aspect of the invention, the temperature at which the CVD operation is performed is increased to improve reflectivity. Specifically, temperatures above about 400 C using a N2-present H2 reduction provide better reflectivity than those below 400 C. This result is unexpected as the reflectivity for H2-only CVD shows the opposite effect. FIGS. 5 and 6 show resistivity and reflectivity, respectively, for H2-only CVD films and N2-present CVD films. FIG. 5 shows that film resistivity for both processes decreases with increasing temperature; this is expected as the faster growth rates result in larger grain sizes, and fewer grain boundaries. FIG. 6 shows that for H2-only CVD, the reflectivity decreases with the increases in temperature. This is also expected as the larger grains that result in lower resistivity increase both the roughness and decrease the reflectivity as they cause more diffuse scattering. Unexpectedly, however, the reflectivity for the N2-present process increases with the increase in temperature: while reflectivity for the 415 C process, for example, decreases from 111% to 108% for the H2-only process, while increasing from 116% to 118% for the N2-present process.

In certain embodiments, the temperature during the N2-CVD cycles are higher than H2-only operations that are performed prior to the N2-CVD cycles. Also, in certain embodiments, the temperature is higher for the N2-present reduction of the N2-CVD cycle than during the H2-only portion of that cycle.

Apparatus

The methods of the invention may be carried out in various types of deposition apparatus available from various vendors. Examples of suitable apparatus include a Novellus Concept-1 Altus, a Concept 2 Altus, a Concept-2 ALTUS-S, a Concept 3 Altus deposition system, or any of a variety of other commercially available CVD tools. In some cases, the process can be performed on multiple deposition stations sequentially. See, e.g., U.S. Pat. No. 6,143,082, which is incorporated herein by reference for all purposes. In some embodiments, the pulsed nucleation process is performed at a first station that is one of two, five or even more deposition stations positioned within a single deposition chamber. Thus, the reducing gases and the tungsten-containing gases are alternately introduced to the surface of the semiconductor substrate, at the first station, using an individual gas supply system that creates a localized atmosphere at the substrate surface.

Another station is then used to perform CVD as described above. Two or more stations may be used to perform CVD in a parallel processing. Alternatively a wafer may be indexed to have the CVD operations performed over two or more stations sequentially.

Figure 7:
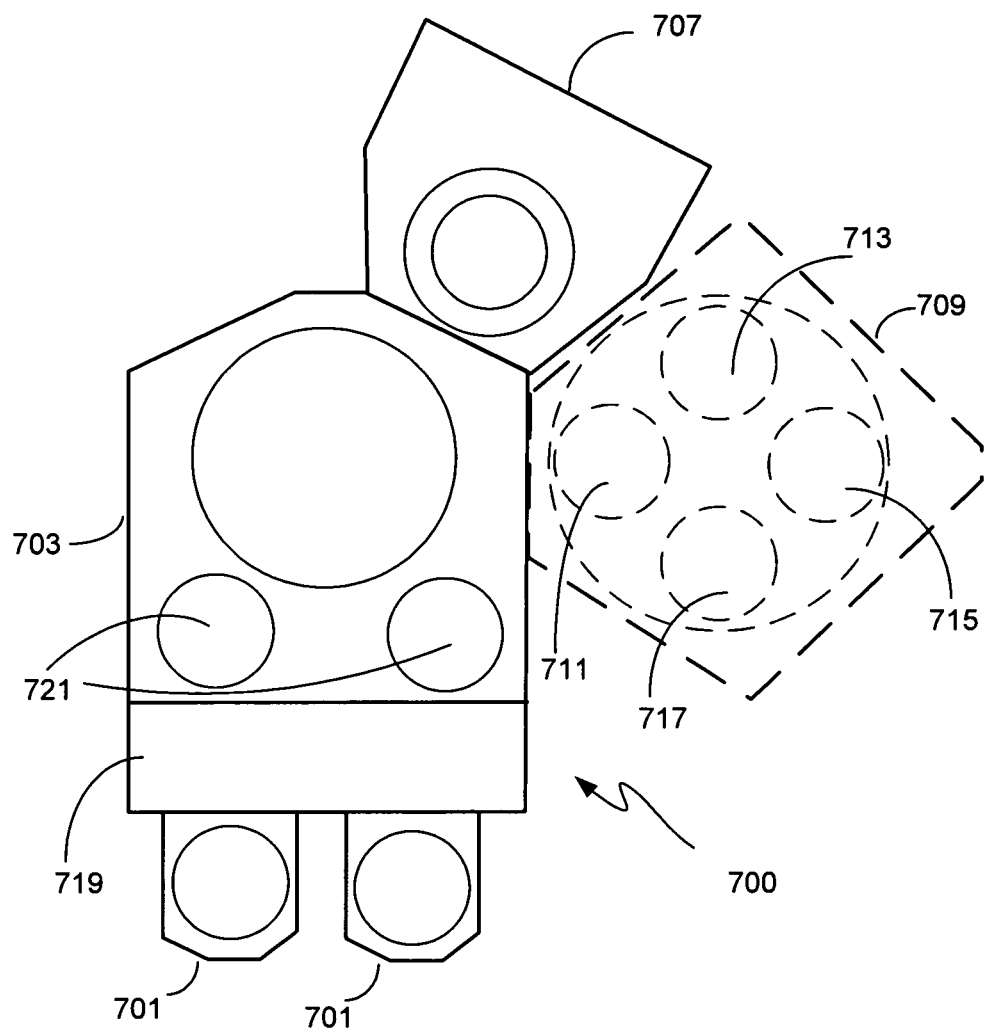
FIG. 7 is a block diagram of a processing system suitable for conducting tungsten deposition process in accordance with embodiments of the invention.

FIG. 7 is a block diagram of a processing system suitable for conducting tungsten thin film deposition processes in accordance with embodiments of the invention. The system 700 includes a transfer module 703. The transfer module 703 provides a clean, pressurized environment to minimize the risk of contamination of substrates being processed as they are moved between the various reactor modules. Mounted on the transfer module 703 is a multi-station reactor 709 capable of performing PNL deposition, multi-pulse treatment if desired, and CVD according to embodiments of the invention. Chamber 709 may include multiple stations 711, 713, 715, and 717 that may sequentially perform these operations. For example, chamber 709 could be configured such that station 711 performs PNL deposition, station 713 performs multi-pulse treatment, and stations 715 and 717 perform CVD.

Also mounted on the transfer module 703 may be one or more single or multi-station modules 707 capable of performing plasma or chemical (non-plasma) pre-cleans. The module may also be used for various other treatments, e.g., post liner tungsten nitride treatments. The system 700 also includes one or more (in this case two) wafer source modules 701 where wafers are stored before and after processing. An atmospheric robot (not shown) in the atmospheric transfer chamber 719 first removes wafers from the source modules 701 to loadlocks 721. A wafer transfer device (generally a robot arm unit) in the transfer module 703 moves the wafers from loadlocks 721 to and among the modules mounted on the transfer module 703.

In certain embodiments, a system controller is employed to control process conditions during deposition. The controller will typically include one or more memory devices and one or more processors. The processor may include a CPU or computer, analog and/or digital input/output connections, stepper motor controller boards, etc.

The controller may control all of the activities of the deposition apparatus. The system controller executes system control software including sets of instructions for controlling the timing, mixture of gases, chamber pressure, chamber temperature, wafer temperature, RF power levels, wafer chuck or pedestal position, and other parameters of a particular process. Other computer programs stored on memory devices associated with the controller may be employed in some embodiments.

Typically there will be a user interface associated with the controller. The user interface may include a display screen, graphical software displays of the apparatus and/or process conditions, and user input devices such as pointing devices, keyboards, touch screens, microphones, etc.

The computer program code for controlling the deposition and other processes in a process sequence can be written in any conventional computer readable programming language: for example, assembly language, C, C++, Pascal, Fortran or others. Compiled object code or script is executed by the processor to perform the tasks identified in the program.

The controller parameters relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and may be entered utilizing the user interface.

Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

The foregoing describes implementation of embodiments of the invention in a single or multi-chamber semiconductor processing tool.

Applications

The present invention may be used to deposit thin, low resistivity tungsten layers for many different applications. One preferred application is for interconnects in integrated circuits such as memory chips and microprocessors. Interconnects are current lines found on a single metallization layer and are generally long thin flat structures. These may be formed by a blanket deposition of a tungsten layer (by a process as described above), followed by a patterning operation that defines the location of current carrying tungsten lines and removal of the tungsten from regions outside the tungsten lines.

A primary example of an interconnect application is a bit line in a memory chip. Of course, the invention is not limited to interconnect applications and extends to vias, contacts and other tungsten structures commonly found in electronic devices. In general, the invention finds application in any environment where thin, low-resistivity tungsten layers are required.

Another parameter of interest for many applications is a relatively low roughness of the ultimately deposited tungsten layer. Preferably, the roughness of the tungsten layer is not greater than about 10% of the total thickness of the deposited tungsten layer, and more preferably not greater than about 5% of the total thickness of the deposited tungsten layer. The roughness of a tungsten layer can be measured by various techniques such as atomic force microscopy.

Other Embodiments

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention.

What is claimed is:

1. A method of forming a tungsten film on a semiconductor substrate, the method comprising:
   depositing a tungsten nucleation layer on the semiconductor substrate; and
   depositing a tungsten bulk layer on the tungsten nucleation layer by a CVD process in which the semiconductor substrate is exposed to multiple pulses of nitrogen during CVD deposition of the tungsten bulk layer with delays between the nitrogen pulses, wherein the CVD deposition of the bulk layer is performed without depositing tungsten by a pulsed nucleation layer (PNL) process during the CVD deposition of the bulk layer.

2. The method of claim 1 wherein depositing a tungsten bulk layer comprises one or more cycles, wherein a cycle comprises at least one CVD operation in which a tungsten-containing precursor is reduced by a reducing agent in the absence of nitrogen to deposit tungsten and at least one CVD operation in which a tungsten-containing precursor is reduced by a reducing agent in the presence of nitrogen to deposit tungsten.

3. The method of claim 2 comprising at least two cycles.

4. The method of claim 2 wherein the tungsten-containing precursor is WF6 and the reducing agent is H2.

5. The method of claim 1 wherein the reflectivity of the deposited tungsten bulk layer is 20% greater than that of a bare silicon wafer.

6. The method of claim 1 wherein the resistivity of the deposited tungsten bulk layer is less than about 15 micro-ohm-cm.

7. The method of claim 1 wherein the resistivity of the deposited tungsten bulk layer is less than about 13 micro-ohm-cm.

8. The method of claim 1 wherein the deposited bulk layer comprises a first thickness deposited by CVD reduction of a tungsten-containing precursor in the presence of nitrogen and a second thickness deposited by CVD reduction of a tungsten-containing precursor in the absence of nitrogen, wherein the total thickness is the summation of the first and second thicknesses and wherein the ratio of the first thickness to the total thickness is between about 0.2 and 0.9.

9. The method of claim 8 wherein the ratio of the first thickness to the total thickness is between about 0.4 and 0.8.

10. The method of claim 8 wherein the ratio of the first thickness to the total thickness is between about 0.5 and 0.8.

11. The method of claim 8 wherein the ratio of the first thickness to the total thickness is between about 0.6 and 0.8.

12. The method of claim 1 wherein depositing the tungsten nucleation layer comprises alternating pulses of a reducing agent and a tungsten containing precursor over the substrate to deposit the nucleation layer by a PNL process.

13. The method of claim 1 wherein depositing the tungsten bulk layer comprises at least one CVD operation in which a tungsten-containing precursor is reduced by a reducing agent in the absence of nitrogen to deposit tungsten and at least one CVD operation in which a tungsten-containing precursor is reduced by a reducing agent in the presence of nitrogen to deposit tungsten, and the temperature during the CVD operation in the presence of nitrogen in higher than that during the CVD operation in the absence of nitrogen.

14. The method of claim 1 wherein depositing the tungsten bulk layer comprises reducing WF6 with H2.

15. The method of claim 1 wherein depositing the tungsten bulk layer comprises multiple sequential CVD operations in which a reducing agent reduces a tungsten-containing precursor in the presence of nitrogen, wherein there is a delay between the multiple sequential CVD operations of at least 1 second.

16. A method of forming a tungsten film on a semiconductor substrate, the method comprising:
    depositing a tungsten nucleation layer on the semiconductor substrate; and
    depositing a tungsten bulk layer on the tungsten nucleation layer by reduction of a tungsten-containing precursor in a CVD process in which the semiconductor substrate is exposed to multiple pulses of nitrogen during deposition of the tungsten bulk layer with delays between the nitrogen pulses such that $\alpha$ is between 0.2 and 0.9, wherein $\alpha$ is the thickness of the tungsten of the tungsten bulk layer deposited in the presence of nitrogen divided by the total thickness of the tungsten bulk layer, wherein deposition of the bulk layer is performed without depositing tungsten by a pulsed nucleation layer (PNL) process during the deposition of the bulk layer.

17. The method of claim 16 wherein $\alpha$ is between 0.5 and 0.8.

18. The method of claim 16 wherein the tungsten bulk layer is deposited by H2 reduction of WF6.

19. An apparatus for depositing tungsten film on a substrate comprising:
    a) deposition chamber comprising: a substrate support and one or more gas inlets configured to expose the substrate to pulses of gas; and
    b) a controller for controlling the operations in the deposition chamber, the controller comprising instructions for simultaneously flowing a tungsten-containing precursor and a reducing agent into the chamber; and for pulsing nitrogen into the chamber with delays between the nitrogen pulses, including instructions for simultaneously flowing the tungsten-containing precursor and the reducing agent into the chamber throughout a delay and instructions for simultaneously flowing the tungsten-containing precursor and the reducing agent into the chamber throughout a nitrogen pulse.

20. A method of forming a tungsten film on a semiconductor substrate, the method comprising:
    depositing a tungsten nucleation layer on the semiconductor substrate;
    depositing a tungsten bulk layer on the tungsten nucleation layer by a CVD process in which the semiconductor substrate is exposed to multiple pulses of nitrogen during CVD deposition of the tungsten bulk layer with delays between the nitrogen pulses;
    wherein depositing a tungsten bulk layer comprises one or more cycles, wherein a cycle comprises at least one CVD operation in which a tungsten-containing precursor is reduced by a reducing agent in the absence of nitrogen to deposit tungsten and at least one CVD operation in which a tungsten-containing precursor is reduced by a reducing agent in the presence of nitrogen to deposit tungsten, wherein the semiconductor substrate is continuously exposed to a tungsten-containing precursor throughout each CVD operation and the tungsten bulk layer does not include intervening pulsed nucleation layer (PNL)-deposited layers.

21. A method of forming a tungsten film on a semiconductor substrate, the method comprising:

depositing a tungsten nucleation layer on the semiconductor substrate;

depositing a tungsten bulk layer on the tungsten nucleation layer by a CVD process in which the semiconductor substrate is exposed to multiple pulses of nitrogen during CVD deposition of the tungsten bulk layer with delays between the nitrogen pulses, wherein the tungsten bulk layer does not include intervening non-bulk layers.

* * * * *